United States Patent [19]

Pavoni et al.

[11] Patent Number: 5,318,091
[45] Date of Patent: Jun. 7, 1994

[54] DIE COATING

[75] Inventors: Mario Pavoni; Luigi Basile, both of Brescia, Italy

[73] Assignee: Borgo-Nova SpA, Turin, Italy

[21] Appl. No.: 976,371

[22] Filed: Nov. 13, 1992

[30] Foreign Application Priority Data

Nov. 22, 1991 [IT] Italy .................. TO91A000905

[51] Int. Cl.$^5$ .................................. B22D 17/22
[52] U.S. Cl. .......................... 164/6; 427/135; 249/114.1; 249/135
[58] Field of Search .................. 164/6, 46, 98; 249/114.1, 116, 134, 135, 142; 427/133, 135, 327, 307; 204/129.65

[56] References Cited

U.S. PATENT DOCUMENTS

| 3,848,847 | 11/1974 | Komatsu et al. | 422/135 |
| 4,085,792 | 4/1978 | Eberle | 249/114.1 |
| 4,250,950 | 2/1981 | Buxmann et al. | 164/122 |
| 4,533,568 | 8/1985 | McClinton et al. | 427/135 |
| 4,636,285 | 1/1987 | Tarumoto et al. | 204/38.5 |
| 4,668,607 | 5/1987 | Wojcik | 164/6 |
| 4,726,412 | 2/1988 | Magnan et al. | 164/46 |
| 5,092,558 | 3/1992 | Katsura | 249/114.1 |
| 5,108,668 | 4/1992 | Kallup | 164/46 |

FOREIGN PATENT DOCUMENTS

| 0212157 | 3/1987 | European Pat. Off. | |
| 0316131 | 5/1989 | European Pat. Off. | |
| 0400683 | 6/1990 | European Pat. Off. | |
| 0256251 | 10/1988 | Japan | 249/135 |
| 0123073 | 5/1989 | Japan | 427/135 |
| 3281033 | 12/1991 | Japan | 164/6 |
| 522086 | 6/1940 | United Kingdom | |
| 644972 | 10/1950 | United Kingdom | |
| 935009 | 5/1962 | United Kingdom | |
| 977808 | 12/1964 | United Kingdom | |
| 2146929A | 5/1985 | United Kingdom | |
| 2171419A | 8/1986 | United Kingdom | |
| 2195939A | 4/1988 | United Kingdom | |

OTHER PUBLICATIONS

Metals Handbook, 9th ed, vol. 5, ASM International, 1982, pp. 334, 367–368.

Primary Examiner—Paula A. Bradley
Assistant Examiner—Erik R. Puknys
Attorney, Agent, or Firm—Nixon & Vanderhye

[57] ABSTRACT

A metal casting die, and a method for its production, are described. By the method the die has provided over at least a part of its internal cavity forming surfaces, indentations of predetermined depth, area and distribution, by employing a technique selected from the group comprising photoetching, electrochemical etching and grit blasting. The die cavity forming surfaces also have thereon, over at least those surfaces with indentations, a coating of a hard, corrosion and erosion resistant material which extends into and between each indentation as a continuous layer.

25 Claims, 2 Drawing Sheets

DIE COATING

The present invention relates to a die having a coating, and a method for its production particularly, though not exclusively, for dies for the casting of metals.

It is common practice in the manufacture of internal combustion engine pistons from aluminium alloys for example, to employ multi-piece permanent dies. The dies are usually made from steel materials and are protected from the corrosive and erosive effects of the molten metal by a die coating or dressing.

The type of protective die coating frequently employed is a paint-on silicate wash. These coatings give an inherently rough surface finish to the die surface, the rough finish being beneficial as will be described later. However, such coatings are very non-uniform in thickness, which is a disadvantage in terms of dimensional accuracy of the cast article, and adhesion of the coating to the die surface tends to be very variable, due in part to the very smooth finish which is generally applied to the die components.

It is usual for such paint-on coatings to be stripped off and replaced at the end of each working shift. A production life of the order of 1000 pistons is common. It is not uncommon for such coatings to have to be repaired during a production shift with the consequent loss of output which this entails.

It is desirable that protective die coatings have an increased life over those which are commonly used.

It is known to use titanium nitride as a die coating in the production of moulded glass articles. Its use as a die coating applied directly to the surface of highly finished die components for casting aluminium alloys has significant disadvantages. Firstly, whilst the coating has a very uniform thickness, which is beneficial, the surface finish is very smooth, matching that of the die components themselves. This latter point is disadvantageous in that a relatively high degree of surface roughness is desirable in a die for casting aluminium alloys. In the case of pistons, the surfaces of the internal piston cavity are used in the as-cast, unmachined condition in an internal combustion engine. A relatively high degree of surface roughness on the die surfaces, especially on those external surfaces of the male core and pin-boss cores which impart the piston cavity features to the final casting, increases the turbulence of the metal as it is poured into the die cavity. The effect of this increased turbulence is to prevent the formation of surface defects such as "cold shuts". When pistons are used in the as-cast, unmachined condition the presence of such defects can lead to fatigue cracking of the metal in service. Secondly, the adhesion of titanium nitride to the smooth die surface can be variable and spalling of some areas of the coating is not unknown. This is disadvantageous as the die coating is difficult to repair, the adherent areas of coating being very difficult to remove.

It is an object of the present invention to provide a die having a coating which is resistant to corrosion and erosion, has high adhesion to the substrate, has a controlled surface roughness, is of uniform thickness and has a longer life than known coatings.

According to a first aspect of the present invention there is provided a method of making a metal die having a coating thereon, the method comprising the steps of forming in at least a part of the internal die cavity forming surfaces, by employing a technique selected from the group comprising photoetching, electrochemical etching and grit blasting, indentations of controlled depth, area and distribution, and depositing over at least those surfaces having indentations, a coating of a hard, corrosion and erosion resistant material which extends into and between each indentation as a continuous layer.

The hard coating may be applied by any suitable technique. Physical vapour deposition (PVD) methods have been found to be particularly suitable, and may include for example, sputtering, reactive sputtering, ion plating, and plasma spraying.

Variation in the depth and/or area of indentations may be achieved by using a sequence of masks in the case of photoetching and electrochemical etching.

In some instances grit blasting may be adequate to produce a desired indented and roughened surface with indentations of controlled depth, area and distribution.

According to a second aspect of the present invention there is provided a metal die having over at least a part of its internal cavity forming surfaces, indentations of predetermined depth, area and distribution, formed by employing a technique selected from the group comprising photoetching, electrochemical etching and grit blasting, the die cavity forming surfaces also having thereon over at least the part of those surfaces with indentations, a coating of a hard, corrosion and erosion resistant material which extends into and between each indentation as a continuous layer.

Preferably, for example, in the case of a piston casting die, at least a male core piece, which may be a multi-piece assembly, has a surface provided with the indentations and the hard coating.

The indentations may be of substantially uniform depth and/or area, or may be of varying depth and/or area in different regions of the die cavity depending upon the requirements for generating metal turbulence in different regions of the die.

The depth of the indentations may typically be in the range from 0.01 millimeter to 0.05 millimeter. The depth may however vary with the area and shape of the indentations.

The cross-sectional shape of the indentations also may be predetermined.

The hard coating may comprise for example, titanium nitride, titanium carbide, silicon carbide or aluminium oxide. The coating material may comprise any material which is resistant to the effects of the material being formed in the die.

The thickness of the hard coating may be dependent upon its constitution. In the case of titanium nitride, for example, a thickness in the range from 1 to 5 micrometers, and preferably, 2 to 4 micrometers has proved effective.

Coated dies according to the present invention and having a coating of titanium nitride have produced over 80,000 pistons without need of repair and without measurable wear of the indented and coated surfaces. This has partly been attributed to the effect of the indentations providing greatly increased adhesion of the titanium nitride layer to the die surface.

Hardness of the newly deposited titanium nitride coating is about 2300 Hv.

In the case of coating a multi-piece male core assembly for a die, for example, it may be beneficial to provide those areas which form the features of the cast article, with both indentations and a hard coating, whilst those faces which merely bear on each other during assembly and disassembly of the die may be provided only with the hard coating to improve mechanical wear resistance.

In order that the present invention may be more fully understood, an example will now be described by way of illustration only with reference to the accompanying drawings, of which:

Figure 3:
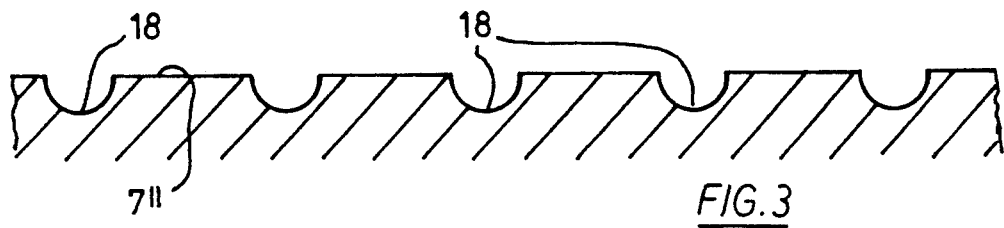
FIG. 3 shows the part of the die of FIG. 2 after etching of the surface thereof, and removal of the mask.
Figure 4:
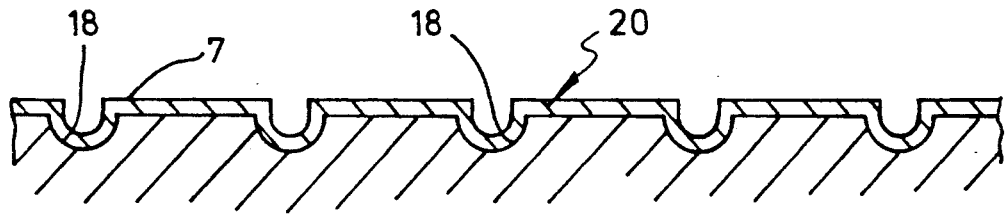
Figure 5:
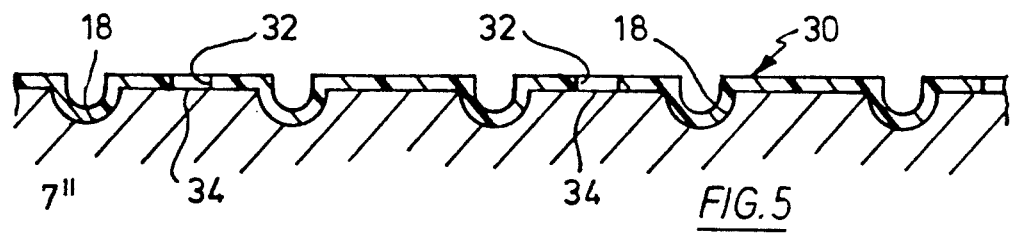
Figure 6:
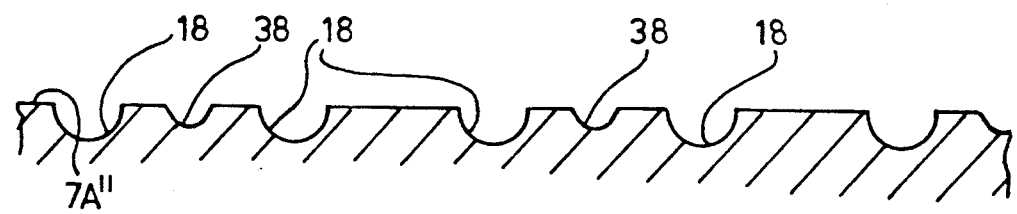
Figure 7:
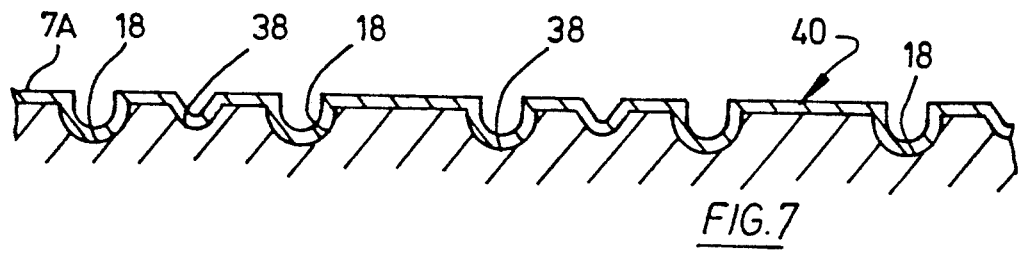

FIG. 4 which shows the part of the die of FIG. 3 after deposition of a hard coating on the surface thereof;

FIG. 5 shows the part of the etched die of FIG. 3, and after another apertured mask of an etch-resistant material is formed thereon;

FIG. 6 shows the part of the die of FIG. 5 after further etching and removal of the second mask; and FIG. 7 shows the part of the die of FIG. 6 after deposition of a hard coating.

Figure 1:
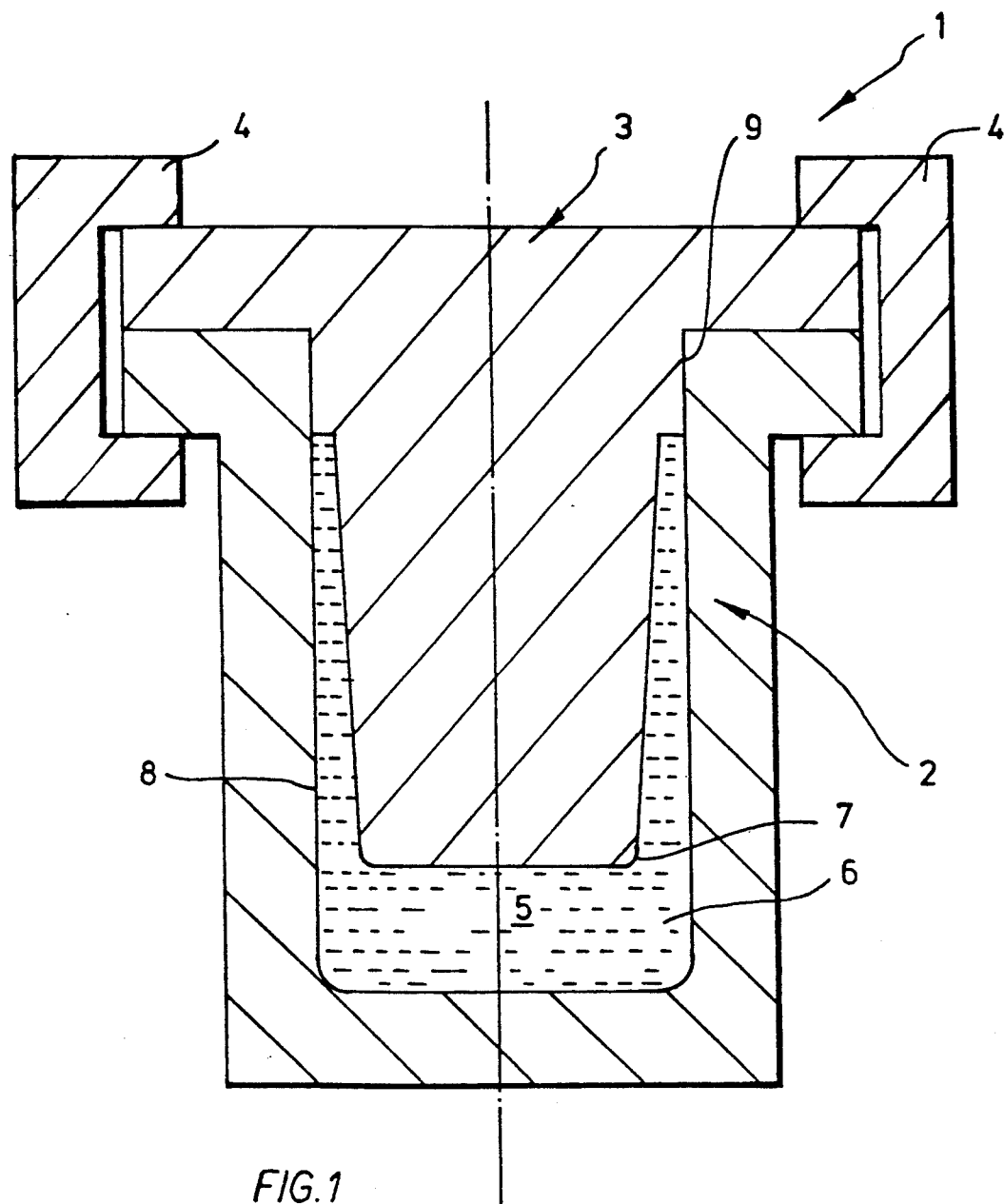
FIG. 1 is a sectional elevation of a metal die for use in casting pistons.

In FIG. 1 a metal die, shown generally at 1, and usually made of steel, has an outer female die portion 2 in the form of a cylinder having a closed end. A male die closing member 3 is held in fixed relationship to the outer die portion 2 by, for example, a clamping arrangement 4. Between the outer die portion 2 and the die closing member 3 there is defined a cavity 5. Molten aluminium alloy 6 is cast within the cavity 5, and comprises a blank to be machined to form a piston for an internal combustion engine. The cavity forming surfaces comprise the surface 7 of the male core piece of the closing member 3, and the opposing portion 8 of the internal surface of the die portion 2. Indicated at 9 are surfaces of the die which are in contact with each other in the assembled die, and which move relatively to each other during assembly and disassembly of the die.

Figure 2:
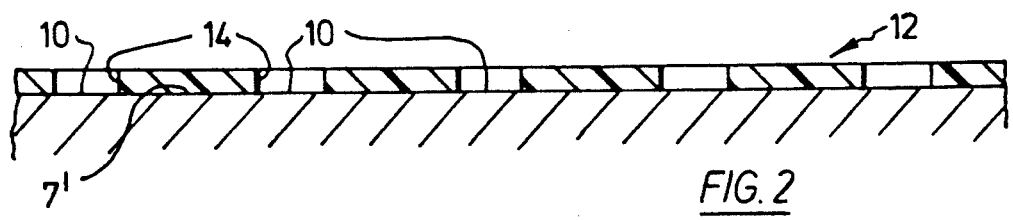
FIG. 2 shows a schematic partial section through part of a die having an apertured mask of an etch-resistant material formed thereon.

Referring now to FIGS. 2 to 4 and where the same features have common reference numerals. The initial surface of the male core piece is indicated at $7^1$. An acid etchant is to be applied selectively to exposed portions 10 of the initial die surface $7^1$ to etch away the steel, leaving indentations. An initially continuous photo sensitive layer is provided. Parts of this layer are then exposed to radiation to which it is sensitive through an applied film mask, (not shown), the film mask representing a predetermined pattern of distributed indentations. The exposed portions of the photosensitive layer are rendered insoluble whilst the unexposed portions are washed away, after removal of the film mask, to leave a plurality of uniform apertures in the exposed layer. If the photo sensitive layer is resistant to the etchant for the initial die surface $7^1$ then the die surface can be etched employing the exposed and apertured photo sensitive layer as an etch-resistant mask 12. Otherwise, first an initially continuous layer of a masking material, resistant to the die etchant, is provided on the initial die surface $7^1$ to be beneath the initially continuous photo sensitive layer. The required etch-resistant mask 12 is provided by etching holes through the masking material using an appropriate etchant therefor, and using the exposed and apertured photo sensitive layer (not shown) as a mask in this process step. By either such route an etch-resistant mask 12 is provided on the initial die surface $7^1$, and through apertures 14 therein the exposed portions 10 of the initial die surface $7^1$ are etched. After indentations 18 of a predetermined depth and area have been created by etching the initial die surface $7^1$, the mask 12 is removed with an appropriate solvent to leave the indented surface $7^{11}$ shown in FIG. 3.

A coating 20 of titanium nitride is then applied to the whole of the indented surface $7^{11}$ by a known reactive sputtering technique to produce the surface shown in FIG. 4, and to provide the final die surface 7. The coating 20 has uniform thickness in the range from 2 to 4 micrometers. In the example shown the depth of the indentations 18 is about 0.02 millimeter.

Instead of the indentations comprising holes or pits, the indentations may comprise channels or grooves in the initial die surface $7^1$, such channels or grooves being arranged as described in, for example, either a parallel or cross-hatched manner. In this instance, the indentations 18 as shown in FIGS. 3 and 4 may be considered as cross-sections through a series of grooves, instead of through holes or pits.

In a modification of the method described above, an already indented die surface, for example, as shown at $7^{11}$ in FIG. 3, has thereon a second etch-resistant mask 30, shown in FIG. 5, and provided in the same manner as the mask 12 as described above. The second mask 30 is provided on the whole of the already indented surface $7^{11}$, and has a pattern of uniform apertures 32 therethrough representing a second predetermined pattern of distributed indentations. Through the apertures 32 are exposed previously unetched portions 34 of the already indented die surface $7^{11}$. Indentations 38 of predetermined depth and area are formed by etching the exposed portions 34 of the already indented die surface $7^{11}$, and provide a further indented surface $7A^{11}$. Subsequently, the mask 36 is removed. As shown in FIG. 6, the indentations 38 are less deep, and each have a smaller area, than the previously formed indentations 18.

Finally, as shown in FIG. 7, a coating 40 of titanium nitride is applied to the whole of the further indented surface $7A^{11}$, and provide the final die surface 7A.

Instead of employing an acid etchant to form the required indentations, electrochemical etching may be employed.

The masks employed may not have apertures of uniform areas, and/or shapes, so that in this way the indentations have non-uniform areas, and/or cross-sectional shapes.

If different etch rates are employed through mask holes of the same size and shape, but in different etching process steps, the ratio of the area to depth of the indentations may vary accordingly.

In any such method the cross-sectional shape of the indentations is predetermined.

Alternatively, instead of employing a mask, or a sequence of a plurality of masks, through apertures of which masks the required indentations are formed by etching, indentations of predetermined depth, area, and distribution are formed by employing a controlled grit blasting technique.

It is not essential that the indentations are formed in the surface 8 of the outer die member 2, but it may be desirable. It is not required that indentations are formed in the cooperating surfaces indicated at 9 and of the die members 2 and 3, and which surfaces bear on each other during die assembly and disassembly. However, it is desirable that all such surfaces are provided with a hard coating.

We claim:

1. A method of making a metal die having a coating thereon for use in casting pistons for internal combustion engines, the method comprising the steps of forming in at least some internal die cavity forming surfaces of the metal die, by employing a technique selected from the group comprising photoetching and electrochemical etching, indentations of controlled depth, area and distribution, and depositing over at least those surfaces having indentations a hard, corrosion and erosion resistant material which extends into and between each indentation as a continuous coating layer, said coating layer having a substantially uniform thickness and a controlled surface roughness, and wherein variation in depth of said indentations is achieved by using a sequence of masks.

2. A method according to claim 1 in which the hard coating is applied by a technique selected from the group comprising sputtering, reactive sputtering, ion plating, plasma spraying.

3. A method according to claim 1 wherein said material comprises one of a group consisting essentially of titanium nitride, titanium carbide, silicon carbide and aluminum oxide.

4. A method according to claim 1 wherein said continuous coating layer has a thickness of from 1 to 5 micrometers.

5. A method according to claim 1 wherein said indentations have a depth in a range from 0.01 to 0.05 millimeters.

6. A method according to claim 1 wherein said continuous coating layer has a hardness of about 2300 Hv.

7. A metal die for use in casting pistons for internal combustion engines having over at least a part of its internal cavity forming surfaces, indentations of predetermined depth, area, distribution and cross sectional shape, formed by employing a technique selected from the group comprising photoetching and electrochemical etching, the die cavity forming surfaces also having thereon over at least the part of those surfaces with indentations, a coating of a hard, corrosion and erosion resistant material which extends into and between each indentation as a continuous coating layer, said coating layer having a substantially uniform thickness and a controlled surface roughness.

8. A die according to claim 7 having a male core piece, and at least the surface of the male core piece having the indentations and the hard coating.

9. A die according to claim 7 in which the indentations are of substantially uniform depth.

10. A die according to claim 7 in which the indentations are of substantially uniform area.

11. A die according to claim 7 in which the indentations are of non uniform depth.

12. A die according to claim 7 in which the indentations are of non uniform area.

13. A die according to claim 7 in which the indentations are holes.

14. A die according to claim 7 in which the indentations are grooves.

15. A die according to claim 7 in which the depth of the indentations lies in the range form 0.01 millimeter to 0.05 millimeter.

16. A die according to claim 15 in which the depth of the indentations is about 0.02 millimeter.

17. A die according to claim 7 in which the hard coating is selected from the group comprising titanium nitride, titanium carbide, silicon carbide and aluminium oxide.

18. A die according to claim 17 in which the hard coating is titanium nitride and has a thickness in the range form 1 to 5 micrometers.

19. A die according to claim 18 in which the thickness lies in the range from 2 to 4 micrometers.

20. A die according to claim 7 wherein said material comprises one of a group consisting essentially of titanium nitride, titanium carbide, silicon carbide and aluminum oxide.

21. A die according to claim 7 wherein said continuous coating layer has a thickness of from 1 to 5 micrometers.

22. A die according to claim 7 wherein said indentations have a depth in a range from 0.01 to 0.05 millimeters.

23. A die according to claim 7 wherein said continuous coating layer has a hardness of about 2300 Hv.

24. A method of making a metal die having a coating thereon for use in casting pistons for internal combustion engines, the method comprising the steps of forming in at least some internal die cavity forming surfaces of the metal die, by employing a technique selected from the group comprising photoetching and electrochemical etching, indentations of controlled depth, area and distribution, and depositing over at least those surfaces having indentations a hard, corrosion and erosion resistant material which extends into and between each indentation as a continuous coating layer, said coating layer having a substantially uniform thickness and a controlled surface roughness, and wherein variation in area of said indentations is achieved by using a sequence of masks.

25. A metal die including internal die cavity forming surfaces for use in casting pistons for internal combustion engines having over at least a part of said internal die cavity forming surfaces, indentations of predetermined depth, area and distribution, formed by employing a technique selected form the group comprising photoetching and electrochemical etching, the die cavity forming surfaces also having thereon over at least the part of those surfaces with indentations, a coating of a hard, corrosion and erosion resistant material which extends into and between each indentation as a continuous coating layer, said coating layer having a substantially uniform thickness and a controlled surface roughness, and wherein at least some of said internal die cavity forming surfaces are provided with both indentations and a hard coating, and other surfaces of the die which are in contact with each other in the assembled die, and which move relatively to each other during assembly and disassembly of the die, have a hard coating only.

* * * * *